US012648473B2

(12) United States Patent
Tanigaki

(10) Patent No.: US 12,648,473 B2
(45) Date of Patent: Jun. 2, 2026

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventor: Tsuyoshi Tanigaki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 385 days.

(21) Appl. No.: 18/569,607

(22) PCT Filed: Jun. 23, 2021

(86) PCT No.: PCT/JP2021/023763
§ 371 (c)(1),
(2) Date: Dec. 13, 2023

(87) PCT Pub. No.: WO2022/269795
PCT Pub. Date: Dec. 29, 2022

(65) Prior Publication Data
US 2024/0266310 A1      Aug. 8, 2024

(51) Int. Cl.
*H10W 72/00* (2026.01)
*H10W 72/30* (2026.01)
*H10W 90/00* (2026.01)

(52) U.S. Cl.
CPC ......... *H10W 72/30* (2026.01); *H10W 72/073* (2026.01); *H10W 72/07331* (2026.01); *H10W 72/352* (2026.01); *H10W 90/734* (2026.01)

(58) Field of Classification Search
CPC ............. H10W 72/013; H10W 72/071; H10W 72/073; H10W 72/351; H10W 72/352; H10W 90/731; H10W 90/734
See application file for complete search history.

(56) References Cited

U.S. PATENT DOCUMENTS

2018/0277507 A1      9/2018   Sugo et al.
2021/0265298 A1      8/2021   Suzuki et al.

FOREIGN PATENT DOCUMENTS

| JP | 2015-012187 A | 1/2015 |
| JP | 5804838 B2 | 11/2015 |
| JP | 6070092 B2 | 2/2017 |
| JP | 2017-066384 A | 4/2017 |
| JP | 2020-021756 A | 2/2020 |

OTHER PUBLICATIONS

International Search Report and Written Opinion mailed on Aug. 31, 2021, received for PCT Application PCT/JP2021/023763, filed on Jun. 23, 2021, 10 pages including English Translation.

*Primary Examiner* — Reema Patel

(74) *Attorney, Agent, or Firm* — XSENSUS LLP

(57) ABSTRACT

Provided is a semiconductor device in which quality of a bonding of a substrate and a semiconductor element via a sintered metal layer is improved. A semiconductor device includes: a substrate; a sintered metal layer; and a semiconductor element, wherein the semiconductor element and the substrate are bonded and electrically connected via the sintered metal layer, cross-section porosity of the sintered metal layer is equal to or less than 2%, the sintered metal layer includes a plurality of crystal grains, and in the sintered metal layer, an unbonded portion that is a portion not occupied by the crystal grains is formed with a diameter of equal to or less than 100 nm in an interface between the crystal grains.

11 Claims, 6 Drawing Sheets

40,40b,40c

F I G. 1
40,40b,40c
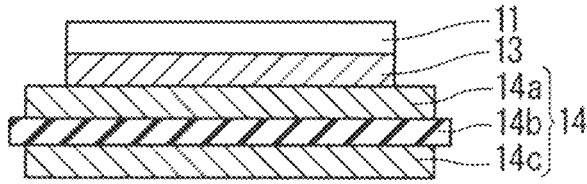
F I G. 2
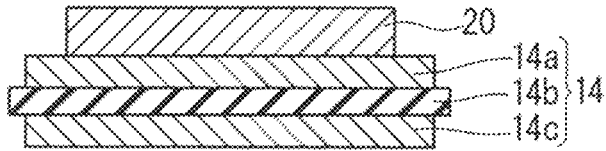
F I G. 3
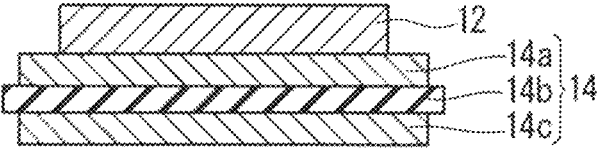
F I G. 4
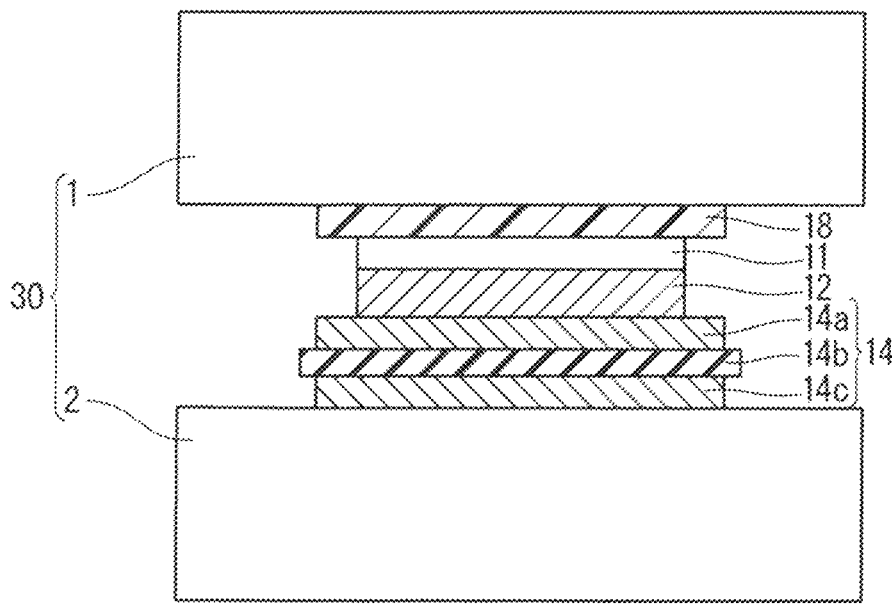

FIG. 12

| | PRESSURIZATION | CROSS-SECTION POROSITY [%] | UNBONDED PORTION OF NANO-ORDER | BONDING RELIABILITY | CRACK IN BONDED ELEMENTS |
|---|---|---|---|---|---|
| FIRST EMBODIMENT | PERFORMED | 0.7 | PRESENT | 2.5 | NOT PRESENT |
| SECOND EMBODIMENT | PERFORMED | 1.7 | PRESENT | 2.4 | NOT PRESENT |
| THIRD EMBODIMENT | PERFORMED | 1.2 | PRESENT | 2.4 | NOT PRESENT |
| FIRST COMPARATIVE EXAMPLE | PERFORMED | 1.5 | NOT PRESENT | 1.2 | PRESENT |
| SECOND COMPARATIVE EXAMPLE | PERFORMED | 2.2 | NOT PRESENT | 1.0 | PRESENT |
| THIRD COMPARATIVE EXAMPLE | PERFORMED | 25.7 | NOT PRESENT | 1.1 | NOT PRESENT |
| FOURTH COMPARATIVE EXAMPLE | PERFORMED | 13.7 | NOT PRESENT | 0.9 | PRESENT |
| FIFTH COMPARATIVE EXAMPLE | PERFORMED | 6.8 | NOT PRESENT | 1.1 | NOT PRESENT |
| SIXTH COMPARATIVE EXAMPLE | NOT PERFORMED | 63.7 | NOT PRESENT | 0.1 | NOT PRESENT |
| SEVENTH COMPARATIVE EXAMPLE | PERFORMED | 10.7 | NOT PRESENT | 1.0 | NOT PRESENT |

F I G. 1 3
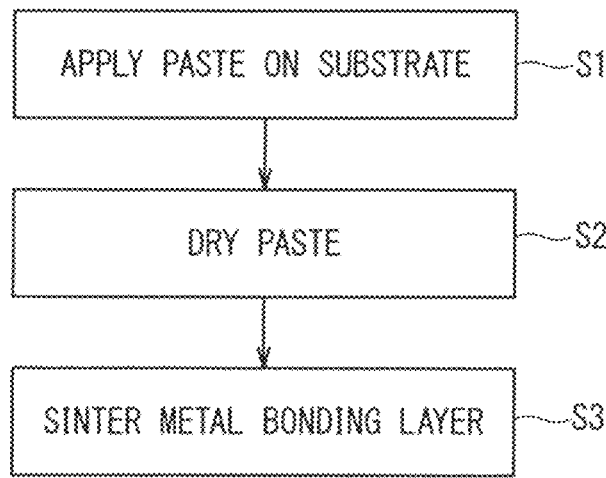

SEMICONDUCTOR DEVICE AND METHOD OF MANUFACTURING SEMICONDUCTOR DEVICE

CROSS-REFERENCE TO RELATED APPLICATION

This application is based on PCT filing PCT/JP2021/023763, filed Jun. 23, 2021, the entire contents of which are incorporated herein by reference.

TECHNICAL FIELD

The present disclosure relates to a semiconductor device and a method of manufacturing the semiconductor device.

BACKGROUND ART

In Patent Document 1, a semiconductor device in which a semiconductor element is bonded on a support substrate via a sintered metal layer is disclosed. In Patent Document 2, a ceramic bonded body in which a ceramic plate and a conductive substrate are bonded via a bonding layer composed of sintered fine copper particles that can be sintered at relatively low temperatures is disclosed. In Patent Document 3, a power module in which a semiconductor element is bonded on a circuit layer by a sintered Ag layer composed of sintered Ag body formed by reduction of silver oxide is disclosed.

PRIOR ART DOCUMENTS

Patent Documents

[Patent Document 1] Japanese Patent Application Laid-Open No. 2020-21756
[Patent Document 2] Japanese Patent No. 5804838
[Patent Document 3] Japanese Patent No. 6070092

SUMMARY

Problem to be Solved by the Invention

In a bonding of a substrate and a semiconductor element by sintered metal according to the prior art, the quality of the bonding is not sufficient.

The present disclosure is intended to solve the above-described problem, and it is an object of the present disclosure to provide a semiconductor device in which quality of a bonding of a substrate and a semiconductor element via a sintered metal layer is improved.

Means to Solve the Problem

A semiconductor device according to the present disclosure is a semiconductor device including: a substrate; a sintered metal layer; and a semiconductor element, wherein the semiconductor element and the substrate are bonded and electrically connected via the sintered metal layer, cross-section porosity of the sintered metal layer is equal to or less than 2%, the sintered metal layer includes a plurality of crystal grains, and in the sintered metal layer, in a 7 μm square range in a cross-section of the sintered metal layer, 10 or more unbonded portions that are portions not occupied by the crystal grains are present with diameters of equal to or less than 50 nm in interfaces between the crystal grains.

Effects of the Invention

According to the present disclosure, a semiconductor device in which quality of a bonding of a substrate and a semiconductor element via a sintered metal layer is improved is provided.

BRIEF DESCRIPTION OF DRAWINGS

FIG. 1 is a diagram schematically showing semiconductor devices of first to third embodiments.

FIG. 2 is a diagram showing a method of manufacturing the semiconductor device of the first embodiment.

FIG. 3 is a diagram showing the method of manufacturing the semiconductor device of the first embodiment.

FIG. 4 is a diagram showing the method of manufacturing the semiconductor device of the first embodiment.

FIG. 12 is a diagram showing results of comparisons among the semiconductor devices of the first to third embodiments and semiconductor devices of first to seventh comparative examples.

FIG. 13 is a flowchart showing the method of manufacturing the semiconductor device of the first embodiment.

DESCRIPTION OF EMBODIMENTS

A. First Embodiment

<A-1. Configuration 1>

Figure 5:
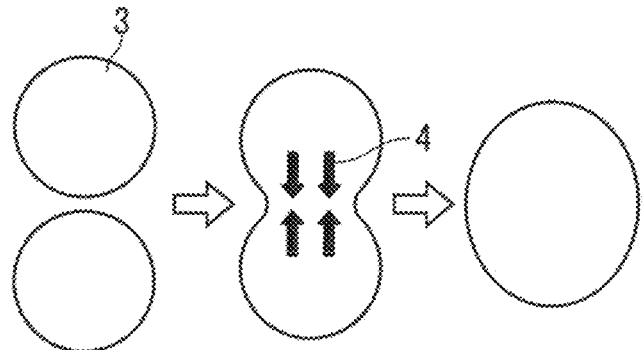
FIG. 5 is a diagram showing an example of mechanisms of sintering of fine metal particles.

FIG. 1 is a diagram showing a semiconductor device 40 of the present embodiment.

The semiconductor device 40 includes a semiconductor element 11, a sintered metal layer 13, and a substrate 14.

The substrate 14 includes an insulating layer 14b, a conductive circuit 14a and a conductive circuit 14c provided on surfaces of the insulating layer 14b.

The semiconductor element 11 is bonded on the conductive circuit 14a of the substrate 14 via the sintered metal layer 13. The semiconductor element 11 is electrically connected to the conductive circuit 14a of the substrate 14. The semiconductor element 11 is, for example, a metal oxide semiconductor field effect transistor (MOSFET), a diode, an insulated gate bipolar transistor (IGBT), or a reverse-conducting IGBT (RC-IGBT). The semiconductor element 11 is, for example, a semiconductor element using any of Si semiconductor, SiC semiconductor, and GaN semiconductor.

The structure of the semiconductor device 40 is not limited to the one shown in FIG. 1. For example, the semiconductor device 40 may be a semiconductor device in which the semiconductor element 11 is sealed with a sealing material. A plurality of the semiconductor elements 11 may be bonded on the substrate 14 in the semiconductor device 40.

The cross-section porosity of the sintered metal layer 13 is equal to or less than 2%. The cross-section porosity of the sintered metal layer 13 means porosity per unit area measured by observing, by using scanning electron microscope (SEM), a cross-section of the sintered metal layer 13 formed by using cross-section polisher.

Figure 7:
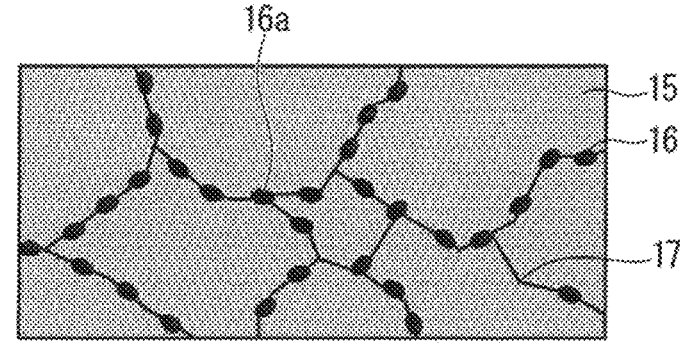
FIG. 7 is a diagram schematically showing sintered metal layers of the semiconductor devices of the first to third embodiments.

FIG. 7 is a diagram schematically showing a cross-section of the sintered metal layer 13 of the semiconductor device 40. As shown in FIG. 7, in the sintered metal layer 13, grain boundaries 17 which are interfaces of crystal grains 15 are formed between the crystal grains 15 included in the sintered metal layer 13. The crystal grains 15 are crystal grains of metal.

In the sintered metal layer 13, unbonded portions 16 of nano-order are present in the grain boundaries 17. The unbonded portions 16 of nano-order are portions between the crystal grains 15 that are not occupied by the crystal grains 15. The unbonded portions 16 of nano-order refer to unbonded portions equal to or less than 100 nm in diameter in the grain boundaries 17. A diameter of an unbonded portion is obtained as a diameter of a circle having the same area with an area of the unbonded portion in a transmission electron microscope (TEM) image obtained by observing, by TEM, a cross-section sample formed by extracting a portion of the sintered metal layer 13 by using focused ion beam (FIB) microsampling method.

In the semiconductor device 40 of the present embodiment, since the cross-section porosity of the sintered metal layer 13 is equal to or less than 2%, high reliability of the bonding is obtained. Since the unbonded portions 16 of nano-order are formed in the grain boundaries 17, when high stress loads are applied, destruction of the bonded elements, namely the semiconductor element 11 and the substrate 14, are suppressed since the grain boundaries are preferentially destroyed.

As described above, the semiconductor device 40 is a semiconductor device in which the quality of the bonding of the substrate 14 and the semiconductor element 11 via the sintered metal layer 13 is high.

In recent years, the market for power modules for power conversion apparatuses such as inverters has continued to expand in a wide range of fields such as electric vehicles and railways. Against the background of growing awareness of environmental protection and energy conservation, the power modules are required to further improve the efficiency of the power conversion. However, power modules using Si semiconductor are limited in improving the efficiency of converting power. In order to further increase the efficiency of power conversion, development of next-generation power modules based on SiC semiconductor and the like is underway.

Power modules using SiC semiconductor can operate at high temperatures equal to or more than 200° C., and the power modules using SiC semiconductor allow not only higher efficiency of power conversion but also significant miniaturization and weight saving. However, lead-free solder, used for bonding materials for semiconductor elements so far, cannot be used in high temperature environments equal to or more than 200° C. due to remelting problems. Therefore, there has been an urgent need for the development of alternative materials to lead-free solder. The sintered metal layer 13 is, for example, used as an alternative material to lead-free solder in a power module used in high temperature environments equal to or more than 200° C. The semiconductor device 40 is a semiconductor device including a semiconductor element using SiC semiconductor as the semiconductor element 11 and is a power module used in high temperature environments equal to or more than 200° C., for example.

The configuration of the semiconductor device 40 is described in more detail in <A-3. Configuration 2> after the method of manufacturing is described.

<A-2. Method of Manufacturing>

FIG. 13 is a flowchart showing the method of manufacturing the semiconductor device of the present embodiment.

First, in Step S1, paste 20 including organic solvent and fine metal particles 3 (refer to FIG. 6) are applied on the substrate 14. The fine metal particles 3 may be coated with organic films. When the fine metal particles 3 are coated with organic films, surface energy of the fine metal particles 3 is suppressed.

The thickness of the paste 20 applied on the substrate 14 is, for example, equal to or more than 50 µm and equal to or less than 200 µm. The paste 20 is applied on the substrate 14 by printing, for example.

The fine metal particles 3 are fine particles of silver in the present embodiment. However, the fine metal particles 3 may be non-silver particles. Melting point of the bulk of the fine metal particles 3 is preferably equal to or more than 900° C. To facilitate sintering reaction, it is preferable that the fine metal particles 3 are particles of precious metals. The fine metal particles 3 are, for example, fine particles of gold, silver, copper, nickel, platinum, or palladium. The fine metal particles 3 may be fine particles of alloy containing any of gold, silver, copper, nickel, platinum, and palladium.

In Step S2, the organic solvent in the paste 20 is volatilized and the paste 20 is dried. If the paste 20 including the organic solvent is sintered to form a sintered metal layer, vacancies of several tens of micrometers or more in diameter are formed in the sintered metal layer, and the cross-section porosity of the sintered metal layer increases accordingly. Therefore, for the purpose of decreasing the cross-section porosity, in Step S2 before Step S3, the organic solvent in the paste 20 is volatilized.

Preferably, the temperature when the paste 20 is dried in Step S2 is equal to or more than the volatilization temperature of the organic solvent and is a temperature at which the fine metal particles 3 do not start sintering. In Step S2, the temperature of the paste 20 is maintained between equal to or more than 50° C. and equal to or less than 100° C. for equal to or less than one hour to volatilize the organic solvent in the paste 20, for example. A metal bonding layer 12 is obtained by volatilization of the organic solvent in the paste 20, as shown in FIG. 3. The metal bonding layer 12 is a metal bonding layer in unsintered state.

In Step S3, the semiconductor element 11 and the substrate 14 are bonded by sintering the metal bonding layer 12 by using a heat press 30. As shown in FIG. 4, the heat press 30 includes an upper heater 1 and a lower heater 2. Due to low melting point effect of the fine metal particles, the metal bonding layer 12 can be sintered at a temperature lower than the melting point of the bulk metal. A dense and strong sintered metal layer 13 can be formed by pressurization.

In Step S3, first, the metal bonding layer 12, the semiconductor element 11, and the substrate 14 are arranged between the upper heater 1 and the lower heater 2 in a state where the metal bonding layer 12 is sandwiched between semiconductor element 11 and the substrate 14. To suppress the breaking of the semiconductor element 11 under a load caused by heating and pressurizing by the heat press 30, a buffer material 18 which is not broken by the heating and pressurizing is placed on the semiconductor element 11. Material of the buffer material 18 is preferably fluorine-based high molecular-weight compound. The fluorine-based high molecular-weight compound used for the material of the buffer material 18 is, for example, polytetrafluoroethylene (PTFE).

In Step S3, next, the metal bonding layer 12 is heated and pressurized to be sintered when the upper heater 1 and the lower heater 2 approach each other. The metal bonding layer 12 is sintered and becomes the sintered metal layer 13. The semiconductor element 11 and the substrate 14 are bonded via the sintered metal layer 13 as the metal bonding layer 12 becomes the sintered metal layer 13.

Figure 6:
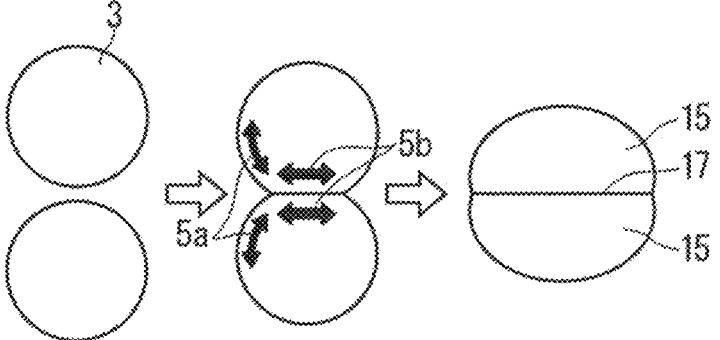
FIG. 6 is a diagram showing an example of mechanisms of sintering of fine metal particles.

Temperature $T_2$ of the metal bonding layer 12 and pressure $P_2$ applied to the metal bonding layer 12 in the sintering process of Step S3 are such that mutual diffusion between the fine metal particles 3 is difficult to occur. The mutual diffusion is diffusion of metal atoms between the different fine metal particles 3. FIG. 5 is a diagram showing a situation in which the fine metal particles 3 are bonded with each other by the mutual diffusion shown by arrows 4. The fine metal particles 3 are integrated when the fine metal particles 3 are bonded with each other by the mutual diffusion. On the other hand, when the fine metal particles 3 are bonded with each other by surface diffusion shown by arrows 5a and grain boundary diffusion shown by arrows 5b in FIG. 6, the fine metal particles 3 are not integrated, and a grain boundary 17 is formed between the crystal grains 15, as shown in FIG. 6.

Since surface energy of small fine metal particles, fine metal particles less than 100 nm in particle diameter for example, is large, the small fine metal particles mutually diffuse at lower temperatures than melting point of bulk metal. Therefore, it is preferable that fine metal particles less than 100 nm is not included in the paste or amount of fine metal particles less than 100 nm included in the paste is small. In the present embodiment, the paste 20 includes a fine metal particle 3 equal to or more than 100 nm in particle diameter. The paste 20 preferably includes a fine metal particle 3 equal to or more than 100 nm and equal to or less than 500 nm in particle diameter. The average particle diameter of the fine metal particles 3 included in the paste is equal to or more than 100 nm and equal to or less than 500 nm. A particle diameter of a fine metal particle 3 included in the paste 20 is obtained as a diameter of a circle having the same area with projected area of the fine metal particle 3 measured by microscope such as SEM. The average particle diameter of the fine metal particles 3 is the number average of the particle diameter of each of the fine metal particles 3.

For the surface diffusion in the surfaces of the fine metal particles 3 and the grain boundary diffusion in the interfaces of the fine metal particles 3 to occur in moderation, the temperature $T_2$ is, for example, equal to or more than 150° C. and equal to or less than 350° C. The temperature $T_2$ is preferably equal to or more than 250° C. and equal to or less than 300° C.

The pressure $P_2$ is, for example, equal to or more than 5 MPa. The pressure $P_2$ is preferably equal to or more than 30 MPa and equal to or less than 50 MPa, for example.

The time $t_2$ of the sintering process in Step S3 is less than 1 hour. If the temperature of the substrate 14 remains high for a long period of time, a thick oxide film is formed on the surface of the substrate 14, removal of the oxide film takes a long time. By reducing the time $t_2$ of the sintering process, the thickness of the oxide film formed on the substrate 14 is reduced. The time $t_2$ of the sintering process is equal to or less than 15 minutes, for example.

The temperature $T_2$, the pressure $P_2$, and the time $t_2$ are preferably determined so that the ratio of the thickness B of the sintered metal layer 13 after the sintering to the thickness A of the metal bonding layer 12 before the sintering, namely B/A, is not less than 30%.

If the ratio B/A is less than 30%, there is a possibility that the temperature $T_2$ is too high, the pressure $P_2$ is too high, or both, and the mutual diffusion is facilitated to cause volume contraction. Therefore, the ratio B/A is preferably equal to or more than 30%. Even more preferably, the ratio B/A is equal to or more than 40%.

The semiconductor device 40 shown in FIG. 1 is obtained when the metal bonding layer 12 is sintered and becomes the sintered metal layer 13 and the semiconductor element 11 and the substrate 14 are bonded via the sintered metal layer 13. The fine metal particles 3 included in the metal bonding layer 12 are sintered to form the crystal grains 15. The crystal grains 15 may not be perfect crystals and may contain impurities or defects.

<A-3. Configuration 2>

Die shear strength of the semiconductor device 40 of the present embodiment is, for example, equal to or more than 40 MPa.

When the metal bonding layer 12 is sintered under a condition where the mutual diffusion is difficult to occur as in the case of the method of manufacturing the semiconductor device of the present embodiment, the grain boundaries 17 are formed between the crystal grains 15 since the fine metal particles 3 are bonded with each other by the surface diffusion or the grain boundary diffusion. If the mutual diffusion is difficult to occur, since gaps between the fine metal particles 3 remain as vacancies, the unbonded portions 16 of nano-order are formed in the grain boundaries 17. Therefore, as described above, the particle diameters of the fine metal particles 3 are preferably equal to or more than 100 nm.

The unbonded portions 16 of nano-order are vacancies, for example. However, the unbonded portions 16 of nano-order are not limited to the vacancies but can be any portions where the bonding of the crystal grains 15 with each other is inhibited.

The organic films covering the surfaces of the fine metal particles 3 in the paste 20 volatilize when the heat and the pressure are applied in Step S3. However, residue of the organic films that has nowhere to go may remain in the grain boundaries 17. The unbonded portions 16 of nano-order may be where such residues are interfering with the bonding of the crystal grains with each other.

The unbonded portions 16 of nano-order may be such that some of the unbonded portions 16 of nano-order are vacancies and other some of the unbonded portions 16 of nano-order are the residues of the organic films.

If the crystal grains 15 are small, number of boundaries of three crystal grains 15 increases. The unbonded portions 16 of nano-order are more likely to be formed in the boundaries of three crystal grains 15, like an unbonded portion 16a of nano-order in FIG. 7, for example. The sintered metal layer 13 includes a crystal grain 15 equal to or less than 1 μm in grain diameter, for example. The average grain diameter of the crystal grains 15 included in the sintered metal layer 13 is equal to or less than 1 μm, for example. For example, an unbonded portion 16 of nano-order is present in the interfaces of the crystal grains 15 equal to or less than 1 μm in grain diameter. Namely, an unbonded portion 16 that is a portion not occupied by the crystal grains 15 is formed with a diameter of equal to or less than 100 nm in an interface between the crystal grains 15 equal to or less than 1 μm in grain diameter. The sintered metal layer 13 includes a crystal grain 15 equal to or more than 100 nm and equal to or less than 500 nm in grain diameter, for example. The average grain diameter of the crystal grains 15 included in the sintered metal layer 13 is equal to or more than 100 nm and equal to or less than 500 nm, for example. For example, an unbonded portion that is a portion not occupied by the crystal grains 15 is formed with a diameter of equal to or less than 100 nm in an interface between the crystal grains 15 equal to or more than 100 nm and equal to or less than 500 nm in grain diameter.

A grain diameter of a crystal grain 15 of the sintered metal layer 13 is obtained as a diameter of a circle having the same area with an area of the crystal grain 15 measured by SEM in a cross-section of the sintered metal layer 13 formed by using cross-section polisher. The average grain diameter of the crystal grains in the sintered metal layer 13 is number average of the grain diameter of each crystal grain 15 measured by SEM in a cross-section of the sintered metal layer 13 formed by using cross-section polisher. The grain diameter of the crystal grain 15 of the sintered metal layer 13 can be also obtained as a diameter of a circle having the same area with an area of the crystal grain 15 in a TEM image obtained by observing, by TEM, a cross-section sample formed by extracting a portion of the sintered metal layer 13 by using FIB microsampling method. The fact that an unbonded portion is formed at a certain size in an interface of the crystal grains 15 whose grain diameters are within a certain range, can be confirmed by observing the grain diameter of the crystal grains 15 and the size of the unbonded portion 16 by TEM in the same cross-section sample formed by extracting a portion of the sintered metal layer 13 by using FIB microsampling method.

Figure 8:
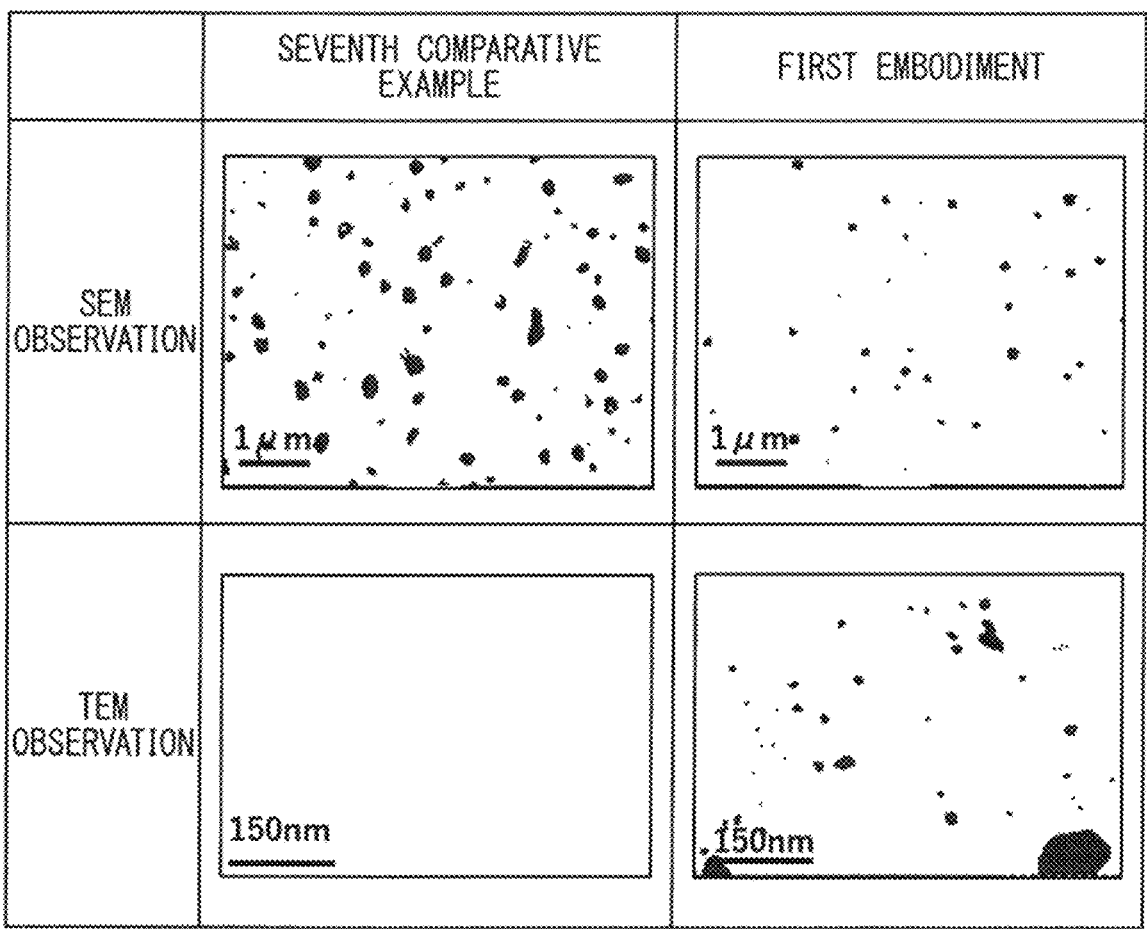
FIG. 8 is a diagram showing SEM images and TEM images of sintered layers of the semiconductor device of the first embodiment and a semiconductor device of a seventh comparative example.

In FIG. 8, panels in right hand side are results of binarization to black and white of a SEM image obtained by SEM observation and a TEM image obtained by TEM observation of cross-sections of the sintered metal layer 13 of the semiconductor device 40.

In FIG. 8, panels in left hand side are results of binarization to black and white of a SEM image and TEM image of cross-sections of a sintered metal layer of a semiconductor device of seventh comparative example (referred to as a semiconductor device 400g).

The semiconductor device 400g of the seventh comparative example is different from the semiconductor device 40 of the present embodiment in the condition in sintering the metal bonding layer 12 in Step S3. The configuration of the semiconductor device 400g of the seventh comparative example is similar to the configuration of the semiconductor device 40 of the present embodiment in other aspects.

The cross-section used for the SEM observations are formed by using cross-section polisher. If a cross-section is formed by mechanical polishing, sagging occurs in the cross-section, and thus a vacancy cannot be observed accurately. Therefore, a method in which mechanical load is not applied to the sintered metal layer 13 should be used when forming the cross-section. The cross-section used for the TEM observations are formed by extracting a portion of the sintered metal layer 13 by using FIB microsampling method.

In the SEM images in FIG. 8, black indicates vacancies. In the TEM images in FIG. 8, black indicates the unbonded portions 16 of nano-order.

As shown in the top left panel of FIG. 8, many vacancies are confirmed in the SEM image of the sintered metal layer of the semiconductor device 400g of the seventh comparative example. In the SEM image of the semiconductor device 400g of the seventh comparative example, the cross-section porosity is 10.7%.

As shown in the bottom left panel of FIG. 8, no unbonded portions 16 of nano-order are confirmed in the TEM image of the sintered metal layer of the semiconductor device 400g of the seventh comparative example.

As shown in the top right panel of FIG. 8, smaller amount of vacancies are confirmed in the SEM image of the sintered metal layer 13 of the semiconductor device 40 of the present embodiment compared to the case of the semiconductor device 400g of the seventh comparative example. The cross-section porosity of the sintered metal layer 13 of the semiconductor device 40 of the present embodiment is 0.7%.

As shown in the bottom right panel of FIG. 8, many unbonded portions 16 of nano-order are confirmed in the TEM image of the sintered metal layer 13 of the semiconductor device 40 of the present embodiment. As described above, the unbonded portion 16 of nano-order can be any portions where the bonding of the crystal grains 15 with each other is inhibited, and the unbonded portions 16 of nano-order may be where residues of organic material are present. Namely, the unbonded portions 16 of nano-order are, for example, vacancies or residues from combustion of organic material, the main component of the residues is carbon.

Figure 9:
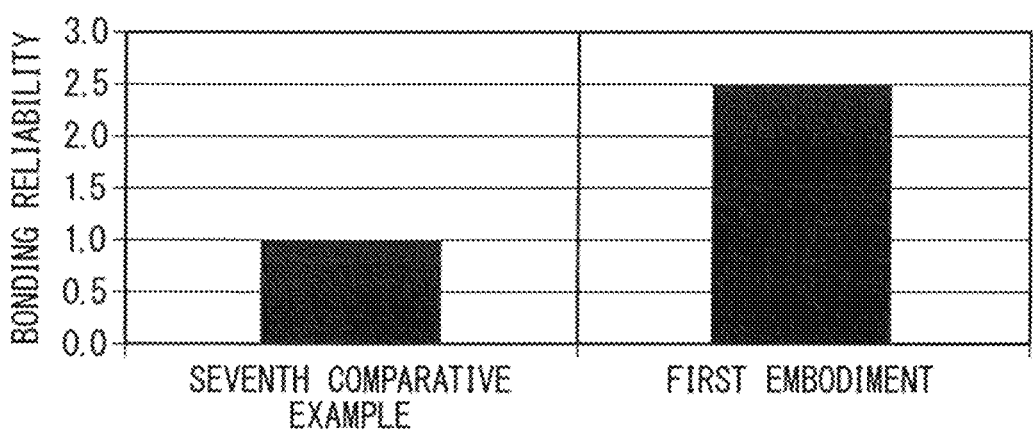
FIG. 9 is a diagram comparing bonding reliability of the semiconductor devices of the first embodiment and the seventh comparative example.

FIG. 9 is a diagram comparing bonding reliability of the semiconductor device 40 of the present embodiment and bonding reliability of the semiconductor device 400g of the seventh comparative example. The cross-section porosity of the sintered metal layer 13 obtained by SEM observation is preferably equal to or less than 2%. As shown in FIG. 9, bonding reliability is 2.5 times higher in the semiconductor device 40 of the present embodiment with low cross-section porosity of the sintered metal layer 13 than in the semiconductor device 400g of the seventh comparative example. Measurement of the bonding reliability is described in detail in <D. COMPARISON AMONG EMBODIMENTS AND COMPARATIVE EXAMPLES>.

In the sintered metal layer 13 of the semiconductor device 40, the unbonded portions 16 of nano-order are present in the grain boundaries 17. When high stress loads are applied to the sintered metal layer 13, due to the presence of the unbonded portions 16 of nano-order, cracks propagate along the grain boundaries 17 and destruction selectively occur. Therefore, destruction of the bonded elements, namely the semiconductor element 11 and the substrate 14, is suppressed.

With many unbonded portions 16 of nano-order, the effect of suppressing the destruction of the bonded elements increases. With many unbonded portions 16 of nano-order, destruction of the semiconductor element 11 due to the thermal stress in the heat cycle test is suppressed.

In the semiconductor device 40, it is preferable that 10 or more unbonded portions 16 of nano-order are present in a 7 μm square TEM observation range in the cross-section of the sintered metal layer 13, for example. For example, 10 or more unbonded portions equal to or less than 50 nm in diameter are present in a 7 μm square range in the cross-section of the sintered metal layer 13. For example, 10 or more unbonded portions 16 of nano-order equal to or less than 50 nm in diameter are present in the interfaces of the crystal grains 15 equal to or less than 1 μm in grain diameter, in a 7 μm square range in the cross-section of the sintered metal layer 13. Distribution of the unbonded portions 16 of nano-order in a cross-section of the sintered metal layer 13 is confirmed by observing, by TEM, a cross-section sample formed by extracting a portion of the sintered metal layer 13 by using FIB microsampling method.

Rigidity deteriorates if vacancies are present in the sintered metal layer 13. When the cross-section porosity of the sintered metal layer 13 is equal to or less than 2%, deterioration of the rigidity of the sintered metal layer 13 is suppressed. Even preferably, the cross-section porosity of the sintered metal layer 13 is equal to or less than 1%. When the cross-section porosity of the sintered metal layer 13 is equal to or less than 1%, the rigidity of the sintered metal layer 13 is even high and the bonding reliability is even high.

B. Second Embodiment

<B-1. Configuration>

FIG. 1 is a diagram schematically showing a semiconductor device 40b according to the present embodiment. The semiconductor device 40b is different from the semiconductor device 40 in the way the metal bonding layer 12 is sintered and turned into the sintered metal layer 13. The semiconductor device 40b is similar to the semiconductor device 40 except the difference based on the difference in the way the metal bonding layer 12 is sintered.

In the semiconductor device 40b, cross-section porosity of the sintered metal layer 13 is 1.7%. Namely, in the semiconductor device 40b, the cross-section porosity of the sintered metal layer 13 is equal to or less than 2%. In the semiconductor device 40b, the sintered metal layer 13 includes a crystal grain equal to or less than 1 μm in grain diameter, for example. In the semiconductor device 40b, the average grain diameter of the crystal grains 15 included in the sintered metal layer 13 is equal to or less than 1 μm, for example. In the semiconductor device 40b, an unbonded portion 16 that is a portion not occupied by the crystal grains 15 is formed with a diameter of equal to or less than 100 nm in an interface between the crystal grains 15 equal to or less than 1 μm in grain diameter. In the semiconductor device 40b, the sintered metal layer 13 includes a crystal grain 15 equal to or more than 100 nm and equal to or less than 500 nm in grain diameter, for example. In the semiconductor device 40b, the average grain diameter of the crystal grains 15 included in the sintered metal layer 13 is equal to or more than 100 nm and equal to or less than 500 nm, for example. In the semiconductor device 40b, for example, an unbonded portion 16 that is a portion not occupied by the crystal grains 15 is formed with a diameter of equal to or less than 100 nm in an interface between the crystal grains 15 equal to or more than 100 nm and equal to or less than 500 nm in grain diameter. In the semiconductor device 40b, it is preferable that 10 or more unbonded portions 16 of nano-order are present in a 7 μm square TEM observation range in the cross-section of the sintered metal layer 13, for example. For example, 10 or more unbonded portions equal to or less than 50 nm in diameter are present in a 7 μm square range in the cross-section of the sintered metal layer 13. For example, 10 or more unbonded portions 16 of nano-order equal to or less than 50 nm in diameter are present in the interfaces of the crystal grains 15 equal to or less than 1 μm in grain diameter, in a 7 μm square range in the cross-section of the sintered metal layer 13.

<B-2. Method of Manufacturing>

A method of manufacturing the semiconductor device of the present embodiment is different from the method of manufacturing the semiconductor device of the first embodiment in detail of Step S3. The method of manufacturing the semiconductor device of the present embodiment is similar to the method of manufacturing the semiconductor device of the first embodiment in other aspects.

In the present embodiment, in Step S3, first, the fine metal particles 3 are pressurized under a temperature in which the fine metal particles 3 are not sintered so that the fine metal particles 3 are in close contact with each other. The temperature of the fine metal particles 3 at this time is preferably equal to or less than 150° C. The pressure applied to the fine metal particles 3 is preferably equal to or less than 50 MPa.

Subsequently, the temperature of the fine metal particles is increased while maintaining the state in which the fine metal particles are pressurized, and the metal bonding layer 12 is sintered. The temperature of the fine metal particles after the increase of the temperature is preferably maintained equal to more than the temperature at which the organic protective film burns and equal to or less than 350° C. The pressure applied to the metal bonding layer 12 after the increase of the temperature is equal to or less than 50 MPa, too.

The heating and the pressurizing in Step S3 finish when the ratio B/A of the thickness B of the sintered metal layer 13 to the thickness A of the metal bonding layer 12 becomes equal to or less than 40%. Even in the case where the ratio B/A does not become equal to or less than 40%, the heating and the pressurizing finish one hour after reaching the temperature at which the metal bonding layer 12 is sintered.

If the temperature of the substrate 14 remains high for a long period of time, the oxide film on the surface of the substrate 14 becomes thick and removal of the oxide film takes a long time. To reduce the cost for removing the oxide film, it is preferable to reduce the time of the sintering process and to form a thin oxide film. The time of the sintering process is equal to or less than 15 minutes, for example.

C. Third Embodiment

<C-1. Configuration>

FIG. 1 is a diagram schematically showing a semiconductor device 40c of the present embodiment. The semiconductor device 40c is different from the semiconductor device 40 in the way the metal bonding layer 12 is sintered and turned into the sintered metal layer 13. The semiconductor device 40c is similar to the semiconductor device 40 except the difference based on the difference in the way the metal bonding layer 12 is sintered.

In the semiconductor device 40c, the cross-section porosity of the sintered metal layer 13 is 1.2%. Namely, in the semiconductor device 40c, the cross-section porosity of the sintered metal layer 13 is equal to or less than 2%. In the semiconductor device 40c, the sintered metal layer 13 includes a crystal grain equal to or less than 1 μm in grain diameter, for example. In the semiconductor device 40c, the average grain diameter of the crystal grains 15 included in the sintered metal layer 13 is equal to or less than 1 μm, for example. In the semiconductor device 40c, an unbonded portion 16 that is a portion not occupied by the crystal grains 15 is formed with a diameter of equal to or less than 100 nm in an interface between the crystal grains 15 equal to or less than 1 μm in grain diameter. In the semiconductor device 40c, the sintered metal layer 13 includes a crystal grain 15 equal to or more than 100 nm and equal to or less than 500 nm in grain diameter, for example. In the semiconductor device 40c, the average grain diameter of the crystal grains 15 included in the sintered metal layer 13 is equal to or more than 100 nm and equal to or less than 500 nm, for example. In the semiconductor device 40c, for example, an unbonded portion 16 that is a portion not occupied by the crystal grains 15 is formed with a diameter of equal to or less than 100 nm in an interface between the crystal grains 15 equal to or more than 100 nm and equal to or less than 500 nm in grain diameter. In the semiconductor device 40c, it is preferable that 10 or more unbonded portions 16 of nano-order are present in a 7 μm square TEM observation range in the cross-section of the sintered metal layer 13, for example. For example, 10 or more unbonded portions equal to or less than 50 nm in diameter are present in a 7 μm square range in the cross-section of the sintered metal layer 13. For example, 10 or more unbonded portions 16 of nano-order equal to or less than 50 nm in diameter are present in the interfaces of the crystal grains 15 equal to or less than 1 μm in grain diameter, in a 7 μm square range in the cross-section of the sintered metal layer 13.

<C-2. Method of Manufacturing>

A method of manufacturing the semiconductor device of the present embodiment is different from the method of manufacturing the semiconductor device of the first embodiment in detail of Step S3. The method of manufacturing the semiconductor device of the present embodiment is similar to the method of manufacturing the semiconductor device of the first embodiment in other aspects.

Figure 10:
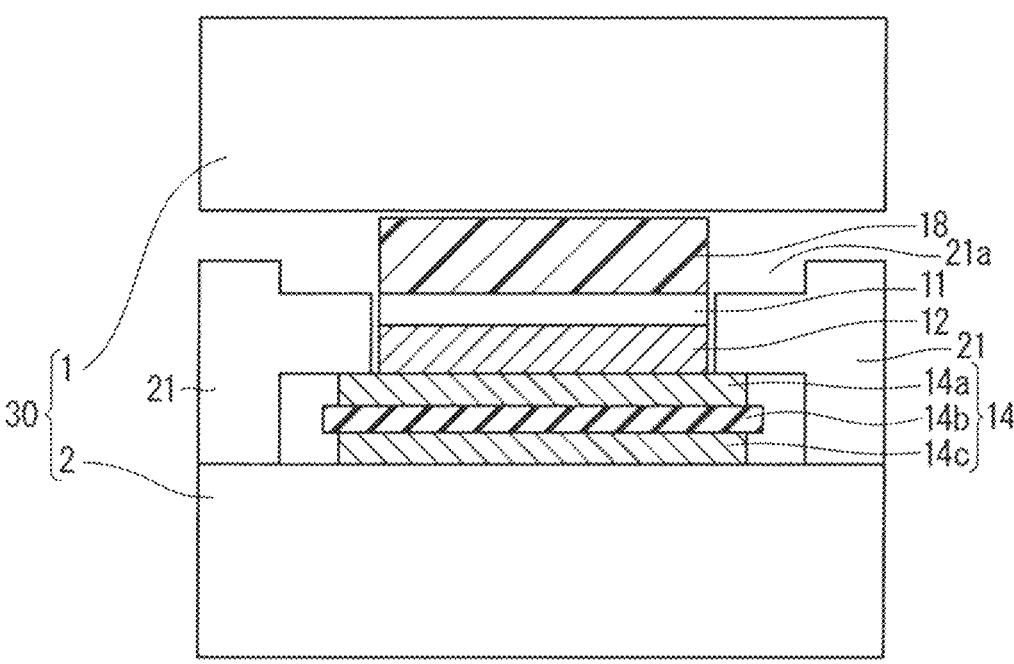
FIG. 10 is a diagram showing a method of manufacturing the semiconductor device of the third embodiment.
Figure 11:
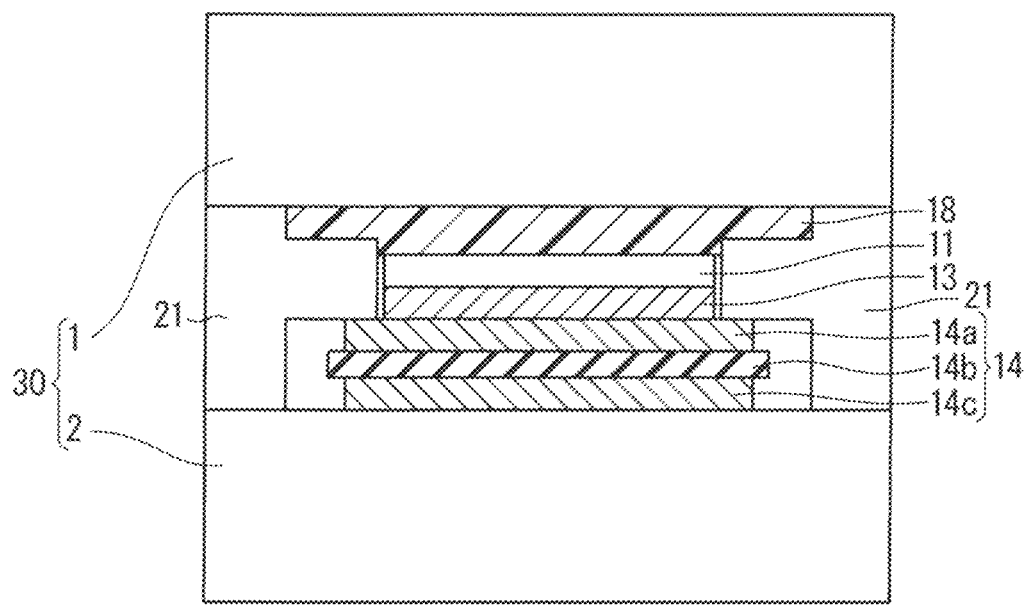
FIG. 11 is a diagram showing the method of manufacturing the semiconductor device of the third embodiment.

In the method of manufacturing the semiconductor device of the present embodiment, in Step S3, a spacer for controlling thickness of the sintered metal layer 13 is used as shown in FIG. 10 and FIG. 11.

In Step S3 of the present embodiment, first, the metal bonding layer 12, the semiconductor element 11, and the substrate 14 are arranged between the upper heater 1 and the lower heater 2 in a state where the metal bonding layer 12 is sandwiched between the semiconductor element 11 and the substrate 14. At this time, the spacer 21 is arranged between the upper heater 1 and the lower heater 2 as shown in FIG. 10. The buffer material 18 deforms as shown in FIG. 11, when the upper heater 1 and the lower heater 2 are brought closer and heating and the pressurizing are performed. Therefore, the spacer 21 preferably have a shape in which a gap 21a into which the deformed buffer material 18 enters is secured. The buffer material 18 has the effect of buffering the pressure on the chip even in the deformed state.

The thickness of the spacer 21 is determined so that the ratio B/A of the thickness B of the sintered metal layer 13 after the sintering to the thickness A of the metal bonding layer 12 before the sintering is equal to or more than 40%, for example.

In the sintering process in Step S3 of the present embodiment, it is only necessary that the processing temperature is equal to or more than 150° C. and equal to or less than 350° C., the pressure is equal to or more than 5 MPa, and the processing time is equal to or less than 1 hour.

D. Comparison Among Embodiments and Comparative Examples

Here, the semiconductor devices of the first to third embodiments and the semiconductor devices of the comparative examples are compared.

FIG. 12 shows comparison results among the semiconductor devices of the first to third embodiments and the semiconductor devices of the first to seventh comparative examples.

In FIG. 12, condition in the manufacturing, state of the sintered metal layer, and results of the thermal shock test are shown for each of the semiconductor devices of the first to third embodiments and the semiconductor devices of the first to seventh comparative examples.

In FIG. 12, the column of "PRESSURIZATION" shows whether or not pressurization is performed in the process of sintering the metal bonding layer 12 in manufacturing each semiconductor device. "PERFORMED" means that the pressurization is performed, and "NOT PERFORMED" means that the pressurization is not performed.

In FIG. 12, the column of "CROSS-SECTION POROS-ITY" shows porosity per unit area measured by observing, by using SEM, a cross-section of the sintered metal layer formed by using cross-section polisher.

In FIG. 12, the column of "UNBONDED PORTION OF NANO-ORDER" shows whether or not an unbonded portion 16 of nano-order is observed when observing, by TEM, a cross-section sample formed by extracting a portion of the sintered metal layer 13 by using FIB microsampling method.

In FIG. 12, the columns of "BONDING RELIABILITY" and "CRACK IN BONDED ELEMENTS" show results of the thermal shock test. The thermal shock test is performed in the temperature range of −75° C. to 200° C., with upper and lower limit temperatures set arbitrarily so that temperature difference is equal to or more than 190° C. The number of cycles at the time peeled portion reaches 10% of the initial bonding area of the sintered metal layer 13 is considered as the lifespan of the sintered metal layer 13. The ratio of the peeled portion of the sintered metal layer 13 is investigated by ultrasonic flaw detection method.

The value of "BONDING RELIABILITY" of each of the semiconductor devices in FIG. 12 is scaled value of the lifespan of the sintered metal layer 13 of each of the semiconductor devices so that the lifespan of the sintered metal layer 13 of the semiconductor device of the seventh comparative example is 1. Namely, the value of "BONDING RELIABILITY" of each of the semiconductor devices in FIG. 12 is the value of the lifespan of the sintered metal layer 13 of each of the semiconductor devices divided by the lifespan of the sintered metal layer 13 of the semiconductor device of the seventh comparative example.

In FIG. 12, the column of "CRACK IN BONDED ELE-MENTS" shows whether or not a crack is present in the bonded elements, namely the semiconductor element 11 or the substrate 14, at the time the peeled portion reaches 10% of the initial bonding area of the sintered metal layer 13 in the thermal shock test.

As shown in FIG. 12, the semiconductor devices with the cross-section porosity equal to or less than 2% have high bonding reliability. The semiconductor device with the cross-section porosity equal to or less than 1% has even high bonding reliability.

In the semiconductor devices with the cross-section porosity equal to or less than 2% and with the unbonded portion 16 of nano-order, namely in the semiconductor devices of the first to third embodiments, both high bonding reliability and suppression of the cracks in the bonded elements are obtained. Thus, the semiconductor devices of the first to third embodiments are semiconductor devices with improved quality of the bonding of the substrates 14 and the semiconductor elements 11 via the sintered metal layers 13.

Each embodiment can be freely combined, and each embodiment can be appropriately modified or omitted.

EXPLANATION OF REFERENCE SIGNS 1 upper heater, 2 lower heater, 3 fine metal particle, 11 semiconductor element, 12 metal bonding layer, 13 sintered metal layer, 14 substrate, 14*a*, 14*c* conductive circuit, 14*b* insulating layer, 15 crystal grain, 16, 16*a* unbonded portion, 17 grain boundary, 18 buffer material, 20 paste, 21 spacer, 21*a* gap, 30 heat press, 40, 40*b*, 40*c* semiconductor device.

The invention claimed is:

1. A semiconductor device comprising:
a substrate;
a sintered metal layer; and
a semiconductor element, wherein
the semiconductor element and the substrate are bonded and electrically connected via the sintered metal layer,
a cross-section porosity of the sintered metal layer is equal to or less than 2%,
the sintered metal layer includes a plurality of crystal grains, and
in the sintered metal layer, in a 7 μm square range in a cross-section of the sintered metal layer, 10 or more unbonded portions that are portions not occupied by the crystal grains are present with diameters of equal to or less than 50 nm in interfaces between the crystal grains.

2. The semiconductor device according to claim 1, wherein
in the sintered metal layer, the unbonded portions are formed in interfaces between the crystal grains equal to or less than 1 μm in grain diameter.

3. The semiconductor device according to claim 1, wherein
an average grain diameter of the plurality of crystal grains included in the sintered metal layer is equal to or less than 1 μm.

4. The semiconductor device according to claim 1, wherein
at least one of the plurality of crystal grains included in the sintered metal layer is equal to or more than 100 nm and equal to or less than 500 nm in grain diameter.

5. The semiconductor device according to claim 2, wherein
in the sintered metal layer, the unbonded portions are formed in interfaces between the crystal grains equal to or more than 100 nm and equal to or less than 500 nm in grain diameter.

6. The semiconductor device according to claim 1, wherein
an average grain diameter of the plurality of crystal grains included in the sintered metal layer is equal to or more than 100 nm and equal to or less than 500 nm.

7. The semiconductor device according to claim 1, wherein
the plurality of crystal grains includes a crystal grain of gold, silver, copper, nickel, platinum, or palladium, or a crystal grain of alloy including gold, silver, copper, nickel, platinum, or palladium.

8. The semiconductor device according to claim 1, wherein
the cross-section porosity of the sintered metal layer is equal to or less than 1%.

9. A method of manufacturing the semiconductor device for manufacturing the semiconductor device according to claim 1, comprising:
preparing a material including a metal particle equal to or more than 100 nm and equal to or less than 500 nm in particle diameter, and
forming the sintered metal layer by sintering the material.

10. The method of manufacturing the semiconductor device according to claim 9, wherein
an average particle diameter of metal particles included in the material is equal to or more than 100 nm and equal to or less than 500 nm.

11. A method of manufacturing a semiconductor device, wherein
the semiconductor device comprises:
a substrate;
a sintered metal layer; and
a semiconductor element,
the semiconductor element and the substrate are bonded and electrically connected via the sintered metal layer,
a cross-section porosity of the sintered metal layer is equal to or less than 2%,
the sintered metal layer includes a plurality of crystal grains,
in the sintered metal layer, an unbonded portion that is a portion not occupied by the crystal grains is formed with a diameter of equal to or less than 100 nm in an interface between the crystal grains,
the method comprises preparing a material including a metal particle whose particle diameter is equal to or more than 100 nm and forming the sintered metal layer by heating and pressurizing to sinter the material, and
the ratio B/A of a thickness B of the sintered metal layer to a thickness A of the material is equal to or more than 30%.

* * * * *